US006258719B1

(12) United States Patent
Shah et al.

(10) Patent No.: US 6,258,719 B1
(45) Date of Patent: Jul. 10, 2001

(54) INTERMETALLIC ALUMINIDES AND SILICIDES ARTICLES, SUCH AS SPUTTERING TARGETS, AND METHODS OF MAKING SAME

(75) Inventors: Ritesh P. Shah, Liberty Lake; Diana L. Morales, Veradale; Jeffrey A. Keller, Spokane, all of WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/108,610

(22) Filed: Jul. 1, 1998

(51) Int. Cl.⁷ ................................................. H01L 21/44
(52) U.S. Cl. ............................................................ 438/682
(58) Field of Search ....................... 438/655, 656, 438/660, 682, 683, 685, 648, 649, 650, 651

(56) References Cited

U.S. PATENT DOCUMENTS

| 4,663,120 | | 5/1987 | Parent et al. ............................ 419/10 |
| 4,762,558 | | 8/1988 | German et al. ......................... 75/246 |
| 4,889,745 | | 12/1989 | Sata ........................................ 427/12 |
| 4,915,903 | * | 4/1990 | Brupbacher et al. ................ 420/129 |
| 5,330,701 | | 7/1994 | Shaw et al. ............................. 419/10 |
| 5,418,071 | * | 5/1995 | Satou et al. .......................... 428/552 |
| 5,508,000 | | 4/1996 | Satou et al. ............................. 419/31 |
| 5,608,911 | | 3/1997 | Shaw et al. ............................. 419/45 |

* cited by examiner

Primary Examiner—David Nelms
Assistant Examiner—Quoc Hoang
(74) Attorney, Agent, or Firm—Wells, St. John, Roberts, Gregory & Matkin, P.S.

(57) ABSTRACT

Described is an in situ method for producing articles of metal aluminide or silicide by reactive sintering and vacuum hot pressing powders and products, such as sputtering targets, produced.

57 Claims, 4 Drawing Sheets

INTERMETALLIC ALUMINIDES AND SILICIDES ARTICLES, SUCH AS SPUTTERING TARGETS, AND METHODS OF MAKING SAME

BACKGROUND

Refractory metals and their suicides are widely used in CMOS DRAMs and logic circuits. Silicides offer lower resistivity compared to doped silicon. In addition, silicides also offer higher thermal stability compared to conventional interconnect materials such as aluminum. There are several ways to obtain refractory metal silicide films on the wafer. The most common method to obtain metal silicide is through the salicide process. The salicide process for obtaining titanium silicide film on a wafer is described below:

1. a layer of Ti is deposited on a wafer by sputtering;
2. first rapid thermal anneal (RTA) step: titanium reacts with silicon forming $TiS_2$ ((C49) phase). This step is done in a nitrogen atmosphere to avoid forming $TiSi_2$ on the oxide and forms a TiN layer on the titanium;
3. the wafer is removed and selectively etched to the TiN and unreacted Ti;
    a. a second RTA step is performed whereby $TiSi_2$ is transformed from the high resistivity phase (C49) to the low resistivity phase (C54).

The process involves four steps including two high temperature rapid annealing steps. The advantage of RTA versus conventional annealing is that RTA reduces the "thermal budget", defined as the time the wafer stays in the furnace at high temperature. In general, reducing the thermal budget is desirable.

An alternative way to obtain a silicide film on a wafer would be by depositing a suilcide film by sputtering a silicide target. Sputter deposition of silicide film using a silicide target offers the following advantages:

1. eliminates the need for high temperature rapid thermal annealing steps, provided a C54 film can be deposited;
2. reduces silicon consumption from the wafer;
3. eliminates the phase transformation step; and
4. provides an opportunity to deposit an amorphous film.

Aluminides of Ti and Ta are useful barrier materials in the manufacture of integrated circuits. During the manufacture of integrated circuits Ti and Al layers often react to form titanium aluminide during wafer processing. However, formation of titanium aluminide during wafer processing is detrimental to the wafer because it introduces additional stresses in the film and also consumes Ti and Al from interconnect wiring. In order to prevent titanium aluminide formation and consumption of interconnect metal in the wafer during processing, it is desirable to deposit titanium aluminide by sputtering a titanium aluminide target Depositing a titanium aluminide film eliminates the introduction of stresses associated with formation of titanium aluminide and unnecessary consumption of interconnect metal.

SUMMARY

The invention relates to a method of making enhanced purity stoichiometric and non-stoichiometric articles, such as targets for sputtering and related microelectronics applications, and to such articles, including targets. Stoichiometric articles are defined as single phase microstructure having a chemical composition as predicted by the phase diagram of the constituent elements e.g. $TiAl_3$, $WSi_2$, $TiSi_2$, etc. Non-stoichiometric articles are defined as articles, such as targets, having a composition slightly away from the stoichiometric composition as predicted by the phase diagram of the constituent elements e.g. $TiSi_{2.4}$, WSi2,8, etc. By practicing the invention it is possible to fabricate single phase stoichiometric articles, such as targets and dual-phase non-stoichiometric articles, such as targets, with high densities, higher purity than the starting material, and fine microstructure. Higher purity targets are beneficial for sputtering because they lead to less defects on the silicon wafer thereby increasing yields.

Enhanced purity stoichiometric and non-stoichiometric articles, such as sputtering targets, in accordance with one aspect of the invention which possess a density of 95% or higher of theoretical density and a microstructure not exceeding 20 microns, depending on the chemistry and composition of the article, e.g. target, and its constituent elements.

Enhanced purity articles, such as targets, are defined as having an overall purity (combination of metallic, non-metallic and gaseous components) higher than that of the starting material. The articles may be manufactured by using a combination of reactive sintering, sintering and vacuum hot pressing. It has been found that such a combination can be performed in situ in a vacuum hot press which enables the process to be a one-step process to manufacture stoichiometric and non-stoichiometric, such as sputtering targets starting from elemental powders, i.e. elements in powder form.

DETAILED DESCRIPTION

One aspect of the invention comprises a one-step method of making enhanced purity, high density, fine microstructure sputtering targets using a combination of reactive sintering and vacuum hot pressing. While the basic fundamentals of the process remain the same, there may be some variations in the process depending on the starting material and final composition required.

A preferred embodiment of the method of the invention comprises a process that includes reactive sintering and vacuum hot pressing together. This process results in a high density blank, i.e., greater than 95% density, for sputtering targets, and to sputtering targets produced therefrom. The invention includes a method of making an article particularly useful as a sputtering target having enhanced purity comprising metal (M) and either silicon (Si) or aluminum (Al), from powder. For the method for producing an aluminide sputtering target, M comprises Ti, Fe, Co, Ni and/or Ta, for producing a silicide target, M comprises Ti, Ta, Ni, Cr, Co and/or Pt. The preferred embodiment of the method may comprise the following steps, which may be combined or rearranged in order:

(a) providing a heat-resisting pressing die having a cavity with a configuration and dimensions desirable for producing the desired article, for example a sputtering target. The die has at least one movable pressing ram adapted for application of axial compaction forces to material in said cavity;

(b) blending metal (M) and either silicon (Si) or aluminum (Al) powder in proportionate ratio to provide the desired composition, advantageously both powders have sizes less than or equal to 45 mm;

(c) adding sufficient amounts of the blended mix into the cavity of the heat- resistant die so as to be able to yield a dense compact having substantially desired dimensions, for example, of a sputtering target;

(d) placing the die a the vacuum hot-press chamber;

(e) applying a containment pressure to the mixture in the die adapted to be under high vacuum conditions by means of at least one moving ram capable of applying uniaxial compaction forces; advantageously, the containment pressure is sufficient to contain said mixture in said die;

(f) evacuating said chamber and said die, preferably about $10^{-4}$ torr or less;

(g) heating said die containing the said mixture in the vacuum hot-press chamber to a first temperature sufficient to remove moisture and to volatilize alkali metals while maintaining uniaxial compaction pressure and a pressure of not more than about $10^{-4}$ torr;

(h) maintaining said first temperature for a time period sufficient to substantially remove gases and alkali metals from the mixture;

(i) heating the said die containing the said mixture in the vacuum hot-press chamber to a second temperature preferably ranging from about 500–1500° C. to allow the powders to reactively sinter under a containing pressure and high vacuum;

(j) increasing uniaxial compaction pressure, preferably about 1000–6000 psi;

(k) maintaining said compaction force under said vacuum and at said second temperature for a time sufficient to allow for reactive sintering process to complete and effect desired compaction of the said mixture;

(l) releasing said compaction force while maintaining high vacuum of preferably about $10^{-4}$ torr or less;

(m) slowly cooling said die to relieve stresses in the compact while maintaining high vacuum, preferably to about 300° C. or less and about $10^{-4}$ torr or less;

(n) releasing vacuum;

(o) removing cooled compact from die; and (p) recovering the article, and further processing as necessary to produce a sputtering target with desired composition and enhanced purity.

Other preferred conditions are:

metal powder having particle sizes smaller than about 45 microns, including aluminum or silicon powder of a size smaller than about 45 microns;

mixing in an inert gas atmosphere;

using a containment pressure in step (e) in the range of about 200–1000 psi;

heating the die at a rate of up to about 5° C./min to a first temperature range of about 300 to 500° C. while maintaining a containment pressure ranging from about 200 to 1000 psi and a vacuum of at least $10^{-4}$ torr;

heating the die at a rate of up to about 10° C./min to a second temperature range of about 500–1000° C. while maintaining a containment pressure of up to 6000 psi and vacuum pressure of $10^{-4}$ torr or less;

heating the die at a rate of up to 10° C./min to a densification and purification temperature range of 900–1500° C. while maintaining a containment pressure of up to 6000 psi and vacuum of at least $10^{-4}$ torr or less;

slowly cooling the die under a containment pressure of up to about 6000 psi until the temperature reaches a minimum of 1300° C., whereafter the containment pressure is released, while maintaining a vacuum pressure at $10^{-4}$ torr or less;

cooling the die in a vacuum pressure of $10^{-4}$ torr or less until the temperature reaches about 500° C. whereafter the die is further cooled by a flowing inert gas;

the inert gas used to cool the die is helium;

the stoichiometric product, for example a sputtering target, comprises or consists essentially of one phase with the second phase not exceeding more than about 1%;

the non-stoichiometric product, for example a sputtering target, comprises or consists essentially of two phases with any and all additional phases not exceeding about 1%;

the characteristics of the enhanced purity stoichiometric and non-stoichiometric article, for example a sputtering target, has a density of at least 95% of theoretical density, substantially no porosity, and impurities that have been reduced by at least 5%;

the density is at least equal to the theoretical density; and the cooled compact has substantially the desired dimensions of the article, for example a sputtering target, which is then ground to the final desired dimensions.

EXAMPLES

One preferred process route is outlined in Table 1. In this and all following examples, some of the steps may be combined, and the process may be performed "in situ" in the same equipment.

TABLE 1

| PROCESS STEP | GENERAL | PREFERRED CONDITIONS |
| --- | --- | --- |
| Blending | Blend appropriate proportions of elemental powders | Ar atmosphere for 30–90 minutes depending on starting material |
| Loading | Pour into graphite dies and load dies into vacuum hot press | |
| Evacuate | Evacuate chamber to achieve a pressure of 10 torr or less | |
| Pre-compaction | To produce "green" compact | 200–1000 psi |
| Degassing | To remove volatile gases and moisture | 300–500° C. |
| Reactive sintering | Powders are sintered reactively to form desired compounds | 500–1000° C., $10^4$ torr, 60–240 minutes |
| Densification and Purification | Apply additional pressure to achieve desired density and removal of volatile reaction products | 1000–6000 psi, $10^4$ torr, 900–1500° C. |
| Cooling | Slow cooling to prevent thermal shock | Furnace cool under atmosphere control |

The process parameters are defined in ranges because it has been found that in order to achieve the desired chemical composition and phases An the sputtering target, temperatures, heating and cooling rates, vacuum, hold times and pressure should be controlled. The specific process parameters will depend on the starting materials art desired composition.

It has also been found that sintering powders which react exothermically results in adiabatic temperature rises. This sudden rise in temperature causes impurities to volatilize which can then be evacuated with a vacuum system. The resulting grain size of the near-net sized product depends on the particle size distribution of elemental powders, and the nucleation and growth of new phases. Since the reaction occurs between powders which are uniformly blended, there are innumerable nucleation sites for new phases. Grain growth requires high temperatures but the new phases are not held at elevated temperature for extended periods of time, and grain growth is restricted, which results in a fine grain structure on the sputtering target. The exact grain size or range depends on the starting material. High pressures for densification are applied when the temperature rises because the reacted powders are then more ductile and easy to compact. Accomplishing this results in high densities. As mentioned previously, achieving desired phases in the product depends on control of the reactive sintering and densification processes in the vacuum hot press. The following examples illustrate the process. The invention described above describes a method to achieve success.

One example of the process for producing $TiAl_3$ articles is described in Table 2.

TABLE 2

| PROCESS STEP | GENERAL | PREFERRED CONDITIONS |
| --- | --- | --- |
| Blending | Blend 37.15 wt % Ti and 62.85 wt % Al powders in a V-blender | Ar atmosphere for 60 minutes |
| Loading | Pour into graphite dies and lead into vacuum hot press | |
| Evacuate | Evacuate chamber to achieve $10^{-4}$ torr pressure | |
| Pre-compaction | Apply pressure to form a compact | 600 psi |
| First Degassing | Remove volatile gases and moisture | 350° C. |
| Compaction | To assist the reactive sintering process | 4000 psi for 180 minutes |
| Reactive sintering | Powders are sintered reactively to form desired compounds | 600° C., $10^{-4}$ torr, hold for 90 minutes |
| Densification and Purification | Apply additional pressure to achieve desired density and removal of volatile reaction products | 5000 psi, $10^{-4}$ torr, 600° C. hold for 90 minutes Note: Pressure for densification can be applied either continuously or in small increments |
| Second Degassing | To remove volatile gases which were not removed by the first degassing step. | 5000 psi, $10^{-4}$ torr, 1050° C., hold for 60 minutes |
| Cooling | Slow cooling to prevent thermal shock | Furnace cool under vacuum |
| Release pressure | release pressure | release pressure |

Since the reactive sintering process is initiated by diffusion and the rate of sintering depends on the packing density of the powders, a compaction step prior to reactive sintering assists in increasing the reaction rate. The degassing step removes moisture. During the reactive sintering process step, the titanium and aluminum powders in this example react to produce $TiAl_{-3}$. Control of process parameters ensures that the reaction occurs uniformly throughout the powder mixture resulting in a fine-grained (due to several nucleating sites) single phase near-net shaped $TiAl_3$ blank. The exothermic nature of the reaction leads to a temperature increase which makes the reacted powder mixture plastic and thus easy to densify. The second degassing step removes the gases given out during the exothermic reactive process. The combination of two degassing steps at low and elevated temperatures prior to and after the reactive sintering step results in reduction of alkali and gaseous impurities and an enhanced purity article especially useful as a sputtering target.

The advantage of the process is reflected by absence of elemental Ti and Al powders in the finished article. This is determined by analyzing the near-net shaped blank using x-ray diffraction, SEM/EDS, arid Atomic Absorption.

Figure 1:
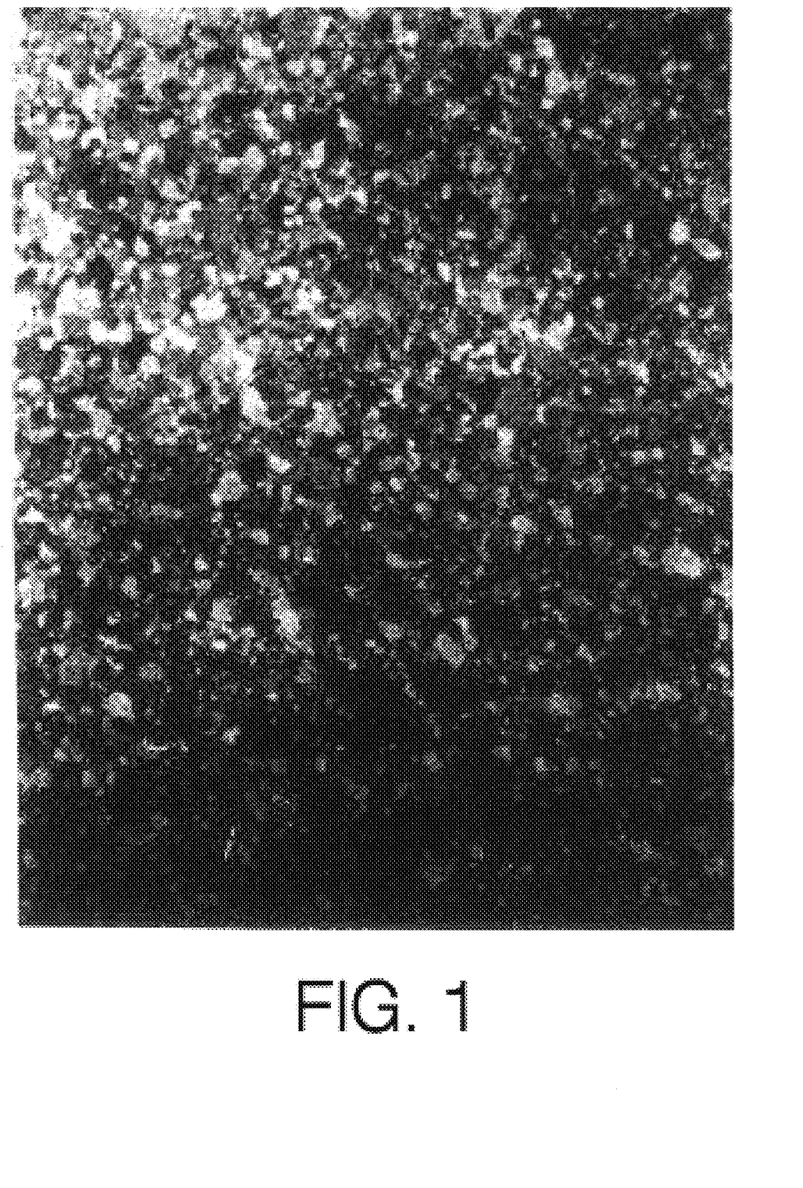
FIG. 1 is a photomicrograph of the grain structure of $TiAl_3$ target produced in accordance with an embodiment of the invention (100x, gain size 18 microns)
Figure 2:
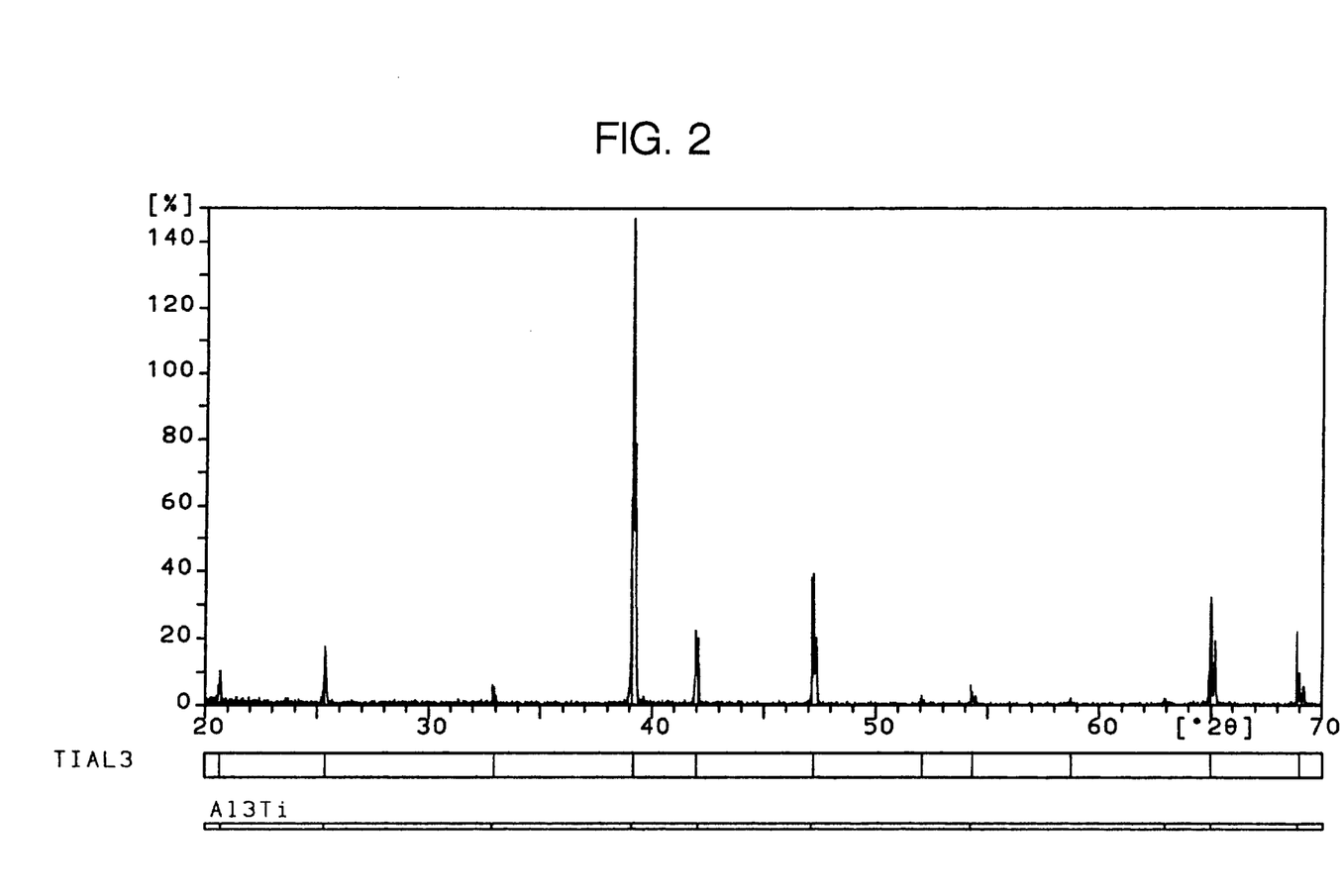
FIG. 2 is a graph showing the x-ray diffraction pattern of a target produced in accordance with one embodiment of the invention.

FIG. 1 shows the grain structure of a $TiAl_3$ target processed using the process described above. The photomicrograph clearly sows that the grain size is less than 20 microns. FIG. 2 shows the x-ray diffraction pattern of a sample piece obtained from the target. The x-ray diffraction pattern shows the presence of a single phase $TiAl_3$ compound Chemical analysis using GDMS, LECO and SIMS confirm that the purity of the finished product was higher than that of the original starting powders.

An example of a method of making non-stoichiometric $TiSi_2$ blank useful as a sputtering target is described in Table 3.

TABLE 3

| PROCESS STEP | GENERAL | PREFERRED |
| --- | --- | --- |
| Blending | Blend-325 mesh proportions of elemental titanium and silicon powders | Ar atmosphere for 60 minutes |
| Loading | Pour into graphite dies and load dies into vacuum hot press | |
| Evacuate | Evacuate chamber to achieve $10^4$ torr pressure | |
| Pre-compaction | Apply pressure to compact | 736 psi |
| Degassing | To remove volatile gases and moisture | 315° C. |
| Reactive sintering | Powders are sintered reactively to form desired compounds | 965° C., $10^{-4}$ torr, 120 minutes Note: Pressure for densification can be applied either continuously or in small increments |
| Densification and Purification | Apply additional pressure to achieve desired density and removal of volatile reaction products | 5000 psi, $10^{-4}$ torr, hold for 120 minutes at 965° C. |
| Second Degassing | To remove volatile gases which were not removed by the first degassing step. | 1360° C. for 90 minutes; 5000 psi |
| Cooling | Slow cooling to prevent thermal shock | Furnace cool under vacuum until temperature reaches 1100° C. followed by backfilling with He and cooling fans Note: Cooling rates can be varied depending on product requirements |
| Release pressure | To prevent mechanical shock during cooling | Release pressure at 1100° C. |

Figure 3:
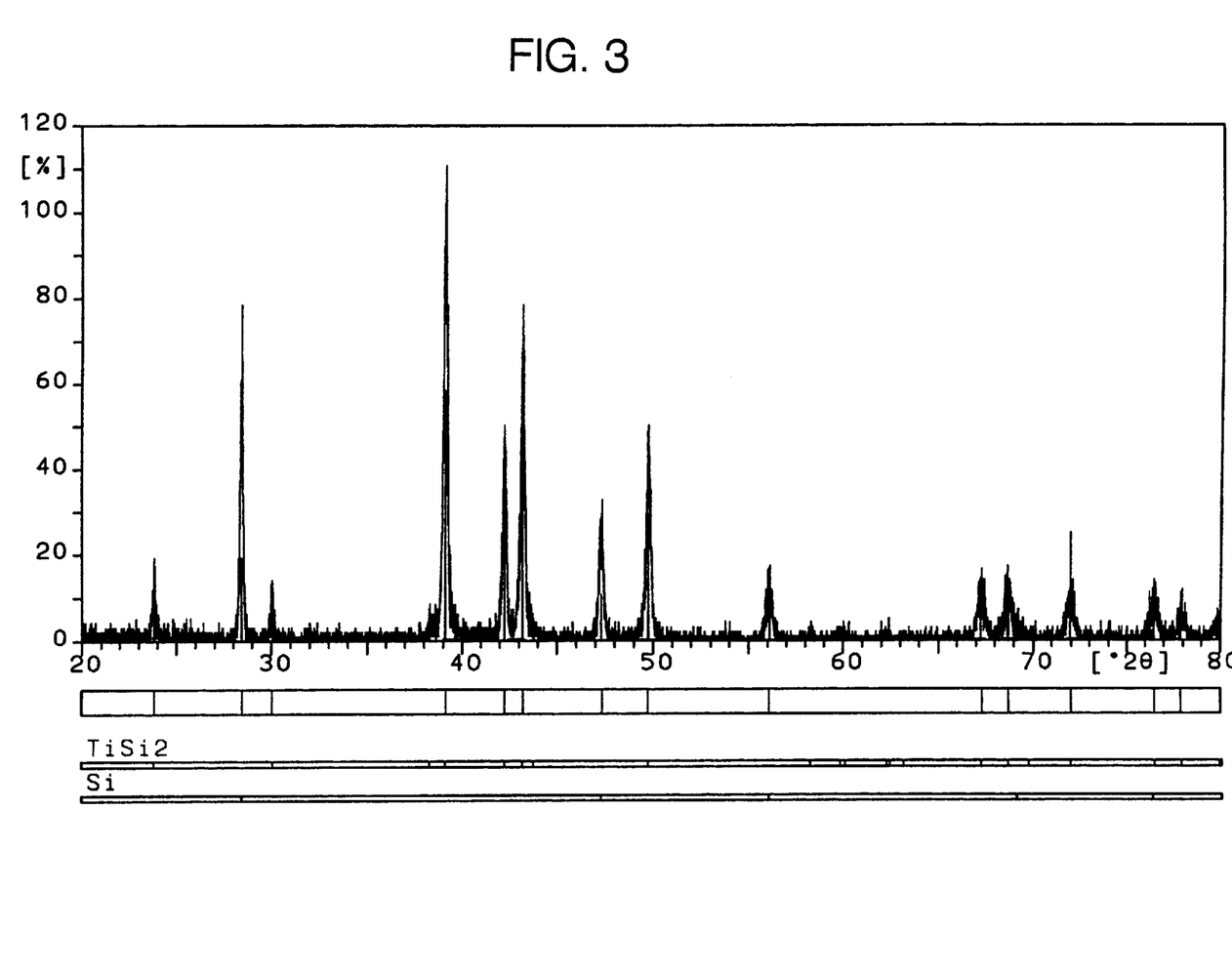
FIG. 3 is a graph of an analysis of titanium silicide.
Figure 4:
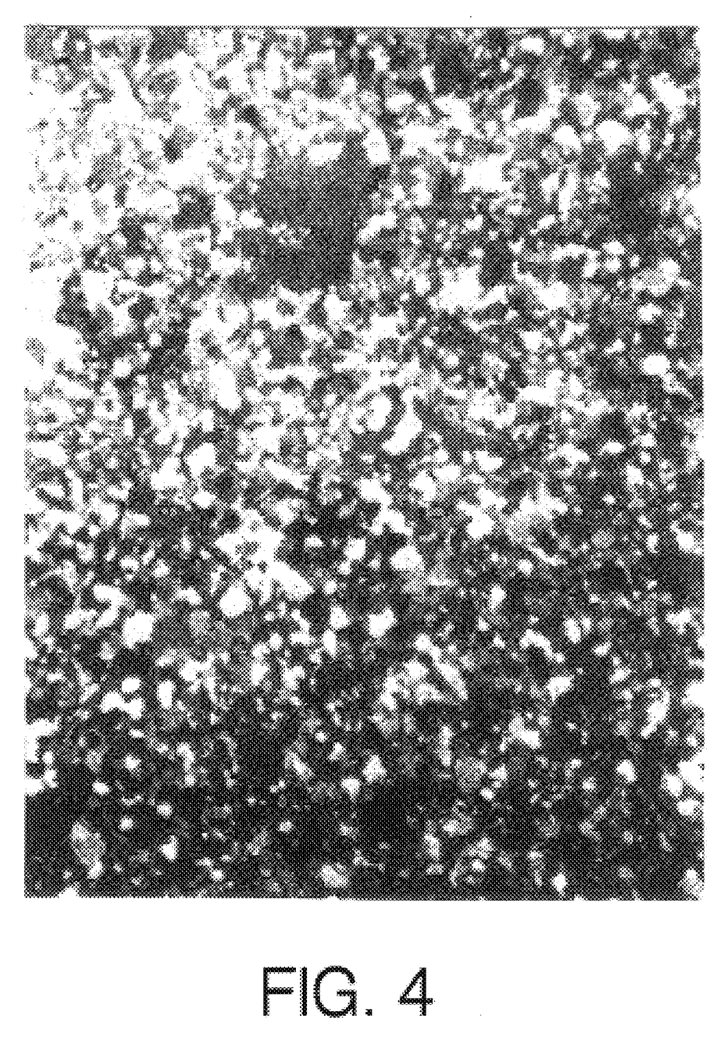
FIG. 4 is a photomicrograph of the grain structure of $TiSi_2$ target produced in accordance with one embodiment of the invention (100x, grain size, 18 microns; cracks observed are an artifact of the sample mounting, grinding and polishing process).

FIG. 3, which represents the analysis of titanium silicide target using x-ray diffraction revealed that the target contained two phases as expected. The two phases were $TiSi_2$ and Si. Further analysis indicated that the $TiSi_2$ is in the C54 phase, which is a low resistivity phase. The microstructural analysis showed a fine microstructure with an average grain size less than 20 microns (FIG. 4). GDMS, LECO and SIMS analysis showed that the overall purity of the target was higher than that of the staring powders.

Tables 4, 5 and 6 describe typical compositions of titanium aluminide, titanium silicide and tungsten silicide, respectively, which may be produced. Furthermore, when these compositions are produced as sputtering targets, it has been confirmed that the targets will produce films of titanium aluminide, titanium silicide and tungsten silicide, respectively, on a substrate.

TABLE 4

99.98% pure $TiAl_3$
Units = ppm

| Element | Maximum |
|---|---|
| Ag | 1.00 |
| Al | MC |
| As | 1.00 |
| B | 2.00 |
| Ca | 10.00 |
| Cl | 10.00 |
| Co | 2.00 |
| Cr | 10.00 |
| Cu | 15.00 |
| Fe | 25.00 |
| In | 5.00 |
| K | 0.50 |
| Li | 0.10 |
| Mg | 10.00 |
| Mn | 10.00 |
| Mo | 1.00 |
| Na | 1.00 |
| Nb | 1.00 |
| Ni | 15.00 |
| P | 15.00 |
| Pb | 5.00 |
| S | 15.00 |
| Si | 50 |
| Sn | 5.00 |
| Th | 0.10 |
| U | 0.10 |
| V | 5.00 |
| Zn | 5.00 |
| Zr | 5.00 |
| O | 3000 |
| C | 100 |
| N | 300 |

Maximum Total Metallic Impurities: 200 ppm
Method of Analysis: C, O, N, by LECO; Na, K, Li by SIMS; all others by GDMS
Molar Ratio controlled to within +/− 0.1 of nominal value. Major constituents analyzed by Flame A.A.
Metallographic analysis is routinely performed on each manufactured lot of $TiAl_3$ ensuring lot-to-lot and target-to-target consistency. Incoming powders must meet stringent particle size requirements.

TABLE 5

99.995% pure $TiSi_{2xx}$
Units = ppm

| Element | Maximum |
|---|---|
| Ag | 0.10 |
| Al | 15.00 |
| As | 1.00 |
| B | 2.00 |
| Ca | 2.00 |
| Cl | 10.00 |
| Co | 2.00 |
| Cr | 10.00 |
| Cu | 2.00 |
| Fe | 15.00 |
| In | 0.10 |
| K | 0.10 |
| L | 0.0001 |
| Mg | 0.05 |
| Mn | 0.30 |

TABLE 5-continued 99.995% pure $TiSi_{2xx}$
Units = ppm

| Element | Maximum |
|---|---|
| Mo | 1.00 |
| Na | 5.00 |
| Nb | 1.00 |
| Ni | 5.00 |
| P | 2.50 |
| Pb | 0.10 |
| S | 5.00 |
| Si | MC |
| Sn | 3.00 |
| Th | 0.001 |
| U | 0.001 |
| V | 1.00 |
| Zn | 0.50 |
| Zr | 2.50 |
| O | 3000 |
| C | 100 |
| N | 100 |

Maximum Total metallic Impurities: 50 ppm
Method of Analysis: C, O, N, by LECO; Na, K, Li by SIMS; all others by GDMS
Molar Ratio controlled to within +/− 0.1 of nominal value. Silicon concentration analyzed by Inductively Coupled Plasma Mass Spectrograph or Atomic Absorption techniques.

TABLE 6

99.995% pure $WSi_{2xx}$
Units = ppm

| Element | Maximum |
|---|---|
| Ag | 0.10 |
| Al | 2.00 |
| As | 1.00 |
| B | 0.10 |
| Ca | 2.00 |
| Cl | 2.00 |
| Co | 2.00 |
| Cr | 4.00 |
| Cu | 2.00 |
| Fe | 5.00 |
| In | 0.50 |
| K | 0.50 |
| Li | 0.001 |
| Mg | 0.05 |
| Mn | 0.30 |
| Mo | 1.00 |
| Na | 0.50 |
| Nb | 0.50 |
| Ni | 1.00 |
| P | 2.50 |
| Pb | 0.10 |
| S | 2.00 |
| Si | MC |
| Sn | 1.00 |
| Th | 0.001 |
| U | 0.001 |
| V | 1.00 |
| Zn | 0.50 |
| Zr | 0.50 |
| O | 1000 |
| C | 70 |
| N | 20 |

Maximum Total Metallic Impurities: 50 ppm
Method of Analysis: C, O, N, by LECO; Na, K, Li by SIMS; all others by GDMS
Molar Ratio controlled to within +/− 0.1 of nominal value. Silicon concentration analyzed by Inductively Coupled Plasma Mass Spectrograph or Atomic Absorption techniques.

It is apparent from the foregoing that various changes and modifications may be made without departing from the invention. Accordingly, the scope of the invention should be limited only by the appended claims.

We claim:

1. A method of making articles comprising in situ reactive sintering and hot pressing powders of metal and aluminum, the metal comprising one or more of Ti, Fe, Co, Ni and Ta; the reactive sintering comprising subjecting the powders to a temperature of from about 500° C. to about 1000° C. for a time of from about 60 minutes to about 240 minutes; and the hot pressing comprising subjecting the powders to a pressure of from about 1000 psi to about 6000 psi while heating the powders to a temperature of from about 600° C. to about 1500° C.

2. A method according to claim 1 to produce an article of enhanced purity such that the purity is enhanced by at least 5% of the original purity of the powders from which it is made.

3. An article of enhanced purity made from powders according to claim 1 wherein the purity is enhanced by an amount in the range of about 25 to 50% of the original purity of the powders from which it is made.

4. The method of claim 1 wherein the metal comprises Ti.
5. The method of claim 1 wherein the metal comprises Fe.
6. The method of claim 1 wherein the metal comprises Co.
7. The method of claim 1 wherein the metal comprises Ni.
8. The method of claim 1 wherein the metal comprises Ta.

9. A method of making an article comprising metal (M) and either silicon (Si) or aluminum (Al) from powder where, for producing an aluminide article M comprises one or more of Ti, Fe, Co, Ni and Ta, and for producing a silicide article M comprises one or more of Ti, Ta, Ni, Cr, Co and Pt; the method comprising the following steps, which may be combined or rearranged in order:

(a) providing a heat-resisting pressing die having a cavity with a configuration and dimensions for producing the article, the die having at least one movable pressing ram adapted for application of axial compaction forces to material in said cavity;

(b) blending powders of metal (M) and either silicon (Si) or aluminum (Al) in proportionate ratio to provide a blended mix of a desired composition;

(c) adding sufficient amounts of the blended mix into the cavity of the heat-resistant die to yield a dense compact having substantially desired dimensions;

(d) placing the die in a chamber for vacuum hot pressing;

(e) applying a containment pressure to the mixture in the die adapted to be under high vacuum conditions by means of at least one movable ram capable of applying uniaxial compaction forces;

(f) evacuating said chamber and said die to a vacuum pressure;

(g) heating said die containing the mixture in the chamber to a temperature range sufficient to remove moisture and to volatilize alkali metals while maintaining uniaxial compaction pressure and vacuum pressure;

(h) maintaining said temperature for a time period sufficient to substantially remove gases and alkali metals from the mixture;

(i) heating the die containing the mixture in the chamber to a temperature range to allow the powders to reactively sinter under pressure and high vacuum;

(j) increasing uniaxial compaction pressure;

(k) maintaining said compaction force under vacuum at said temperature for a time sufficient to allow for reactive sintering process to complete and effect desired compaction of the said mixture;

(l) releasing said compaction force while maintaining high vacuum;

(m) slowly cooling the die to relieve stresses in the compact while maintaining high vacuum;

(n) releasing the vacuum; and (o) removing the cooled compact produced from the die.

10. A method according to claim 9 wherein the die is heated at a rate of up to about 5° C./min to a first temperature range of about 300 to 500° C. while maintaining a containment pressure ranging from about 200 to 1000 psi and a vacuum of at least $10^{-4}$ torr.

11. A method according to claim 9 wherein the die is heated at a rate of up to about 10° C./min to a second temperature range of about 500–1000° C. while maintaining a containment pressure of up to 6000 psi and vacuum pressure of $10^{-4}$ torr or less.

12. A method according to claim 9 wherein the die is heated at a rate of up to 10° C./min to a densification and purification temperature range of 900–1500° C. while maintaining a containment pressure of up to 6000 psi and vacuum of at least $10^{-4}$ torr or less.

13. A method according to claim 9 wherein the die is slowly cooled under a containment pressure of up to about 6000 psi until the temperature reaches a minimum of 1300° C., whereafter the containment pressure is released, while maintaining a vacuum pressure at about $10^{-4}$ torr or less.

14. A method according to claim 9 wherein the die is cooled under a vacuum pressure of about $10^{-4}$ torr or less until the temperature reaches about 500° C. whereafter the die is further cooled by a flowing inert gas.

15. A method according to claim 14 wherein the inert gas used to cool the die is helium.

16. A method according to claim 9 wherein the stoichiometric product comprises one phase, and may contain a second phase not exceeding more than about 1%.

17. A method according to claim 9 wherein the non-stoichiometric product comprises two phases with any and all additional phases not exceeding about 1%.

18. A method according to claim 9 wherein the enhanced purity stoichiometric or non-stoichiometric article produced has a density of at least 95% of theoretical density, substantially no porosity, and impurities that have been reduced by at least 5% from the amount of impurities in the starting material.

19. A method according to claim 18 wherein the density is at least equal to the theoretical density.

20. A method according to claim 9 further comprising processing the compact to the final desired dimensions.

21. A method according to claim 20 wherein the compact is processed to produce a sputtering target.

22. A method according to claim 9 wherein the powders are not more than about 45 mm.

23. A method according to claim 9 wherein the aluminum or silicon powders are not more than about 45 microns.

24. A method according to claim 9 wherein the metal powder is not more than about 45 microns.

25. A method according to claim 9 wherein the vacuum pressure recited in step f) Is about $10^{-4}$ torr or less.

26. A method according to claim 9 wherein the compaction pressure in step (j) is increased to about 1000–6000 psi.

27. A method according to claim 9 wherein in step (m) the die is cooled to about 300° C. or less and the high vacuum maintained is a pressure of about $10^{-4}$ torr or less.

28. A method according to claim 9 wherein blending in step (b) is an inert atmosphere.

29. A method according to claim 9 wherein containment pressure in step (e) is about 200–1000 psi.

30. The method of claim 9 wherein the metal is reacted with aluminum to form an aluminide.

31. The method of claim 9 wherein the metal is reacted with aluminum to form an aluminide, and wherein the metal comprises Ti.

32. The method of claim 9 wherein the metal is reacted with aluminum to form an aluminide, and wherein the metal comprises Fe.

33. The method of claim 9 wherein the metal is reacted with aluminum to form an aluminide, and wherein the metal comprises Co.

34. The method of claim 9 wherein the metal is reacted with aluminum to form an aluminide, and wherein the metal comprises Ni.

35. The method of claim 9 wherein the metal is reacted with aluminum to form an aluminide, and wherein the metal comprises Ta.

36. The method of claim 9 wherein the metal is reacted with silicon to form a silicide.

37. The method of claim 9 wherein the metal is reacted with silicon to form a silicide, and wherein the metal comprises Ti.

38. The method of claim 9 wherein the metal is reacted with silicon to form a silicide, and wherein the metal comprises Ta.

39. The method of claim 9 wherein the metal is reacted with silicon to form a silicide, and wherein the metal comprises Ni.

40. The method of claim 9 wherein the metal is reacted with silicon to form a silicide, and wherein the metal comprises Cr.

41. The method of claim 9 wherein the metal is reacted with silicon to form a silicide, and wherein the metal comprises Co.

42. The method of claim 9 wherein the metal is reacted with silicon to form a silicide, and wherein the metal comprises Pt.

43. A method of making an article comprising:

forming a mixture of powders of metal and silicon, the metal comprising one or more of Ti, Ta, Ni, Cr, Co and Pt;

degassing the mixture of powders at a temperature of from 300° C. to 500° C.;

after the degassing, in situ reactive sintering the mixture of powders; and after the sintering, hot pressing the mixture.

44. The method of claim 43 wherein the hot pressing comprises a pressure of from 1000 psi to 6000 psi, and a temperature of from 900° C. to 1500° C.

45. The method of claim 43 wherein the metal comprises Ti.

46. The method of claim 43 wherein the metal comprises Ta.

47. The method of claim 43 wherein the metal comprises Ni.

48. The method of claim 43 wherein the metal comprises Cr.

49. The method of claim 43 wherein the metal comprises Co.

50. The method of claim 43 wherein the metal comprises Pt.

51. A method of making an article comprising:

forming a mixture of powders of metal and aluminum, the metal comprising one or more of Ti, Fe, Ni, Co and Ta;

degassing the mixture of powders at a temperature of from 300° C. to 500° C.;

after the degassing, in situ reactive sintering the mixture of powders; and after the in situ reactive sintering, hot pressing the mixture.

52. The method of claim 51 wherein the hot pressing comprises a pressure of from 1000 psi to 6000 psi, and a temperature of from 900° C. to 1500° C.

53. The method of claim 51 wherein the metal comprises Ti.

54. The method of claim 51 wherein the metal comprises Ta.

55. The method of claim 51 wherein the metal comprises Ni.

56. The method of claim 51 wherein the metal comprises Co.

57. The method of claim 51 wherein the metal comprises Fe.

* * * * *

UNITED STATES PATENT AND TRADEMARK OFFICE
CERTIFICATE OF CORRECTION

PATENT NO. : 6,258,719 B1
DATED : July 10, 2001
INVENTOR(S) : Ritesh P. Shah et al.

It is certified that error appears in the above-identified patent and that said Letters Patent is hereby corrected as shown below:

Column 1,
Line 7, replace "their suicides" with -- their silicides --.
Line 19, replace "TiS$_2$" with -- TiSi$_2$ --.
Line 34, replace "suilcide" with -- silicide --.
Line 53, replace "target" with -- target. --.

Column 4,
Line 67, replace "phases An" with -- phases in --.

Column 5,
Line 3, replace "art" with -- and --.
Line 63, replace "TiAI$_3$" with -- TiAl$_3$ --.

Column 6,
Line 11, replace "arid" with -- and --.

Column 10,
Line 58, replace "Is" with -- is --.

Signed and Sealed this

Twenty-seventh Day of November, 2001

Attest:

*Nicholas P. Godici*

NICHOLAS P. GODICI
*Attesting Officer*      *Acting Director of the United States Patent and Trademark Office*